(12) United States Patent
Edelen et al.

(10) Patent No.: US 6,974,200 B2
(45) Date of Patent: Dec. 13, 2005

(54) FUSE DENSITY ON AN INKJET PRINTHEAD CHIP

(75) Inventors: John G. Edelen, Versailles, KY (US); George K. Parish, Winchester, KY (US); Krisit M. Rowe, Richmond, KY (US); David C. Stevenson, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 50 days.

(21) Appl. No.: 10/713,296

(22) Filed: Nov. 14, 2003

(65) Prior Publication Data

US 2005/0104920 A1 May 19, 2005

(51) Int. Cl.[7] .............................. B41J 29/393; B41J 2/05
(52) U.S. Cl. ........................................ 347/19; 347/57
(58) Field of Search ................................ 347/5, 19, 59; 358/1.16; 365/53, 96, 104, 185.01, 225.7

(56) References Cited

U.S. PATENT DOCUMENTS

| | | | | |
|---|---|---|---|---|
| 3,697,828 A | * | 10/1972 | Oakes | 257/587 |
| 4,064,493 A | * | 12/1977 | Davis | 365/96 |
| 4,112,505 A | * | 9/1978 | Duval et al. | 365/96 |
| 4,723,155 A | * | 2/1988 | Uchida | 257/529 |
| 5,636,172 A | * | 6/1997 | Prall et al. | 365/225.7 |
| 5,843,259 A | | 12/1998 | Narang et al. | 156/151 |
| 5,852,323 A | | 12/1998 | Conn | 257/530 |
| 5,995,774 A | | 11/1999 | Applegate et al. | 399/27 |
| 6,031,275 A | | 2/2000 | Kalnitsky et al. | 257/530 |
| 6,243,109 B1 | * | 6/2001 | Ishinaga et al. | 347/3 |
| 6,271,928 B1 | | 8/2001 | Bullock et al. | 358/1.16 |
| 6,294,453 B1 | | 9/2001 | Marmillion et al. | 438/601 |
| 6,396,121 B1 | | 5/2002 | Bertin et al. | 257/530 |
| 6,452,248 B1 | | 9/2002 | Pham Le | 257/530 |
| 6,460,966 B1 | | 10/2002 | Hellekson et al. | 347/20 |
| 6,512,284 B2 | | 1/2003 | Schulte et al. | 257/530 |
| 6,559,973 B2 | | 5/2003 | Bullock et al. | 358/1.8 |
| 6,568,783 B2 | * | 5/2003 | Hu et al. | 347/19 |
| 6,733,100 B1 | * | 5/2004 | Fujita et al. | 347/12 |
| 2001/0015472 A1 | | 8/2001 | Fukuzumi et al. | |
| 2002/0001093 A1 | | 1/2002 | Bullock et al. | |
| 2002/0060350 A1 | | 5/2002 | Schulte et al. | |
| 2003/0173643 A1 | | 9/2003 | Herner | |
| 2003/0189607 A1 | | 10/2003 | Bullock et al. | |
| 2004/0085405 A1 | * | 5/2004 | Baek | 347/59 |

* cited by examiner

Primary Examiner—Thinh Nguyen
(74) Attorney, Agent, or Firm—Michael Best & Friedrich LLP

(57) ABSTRACT

A programmable memory on an inkjet printhead chip. The memory includes at least a memory array that has a plurality of memory elements, and a bipolar device that isolates a memory element from another memory element in the memory array.

54 Claims, 5 Drawing Sheets

FUSE DENSITY ON AN INKJET PRINTHEAD CHIP

BACKGROUND OF THE INVENTION

The present invention relates to inkjet printers, and particularly to memory on the heater chip of an inkjet printhead.

An inkjet printhead generally has a heater chip. The heater chip typically includes logic circuitry, a plurality of power transistors, and a set of heaters or resistors. A hardware or software printer driver will selectively address or energize the logic circuitry such that appropriate resistors are heated for printing. The memory is also used to identify the printhead to determine if the printhead is a monochrome printhead, a color printhead or a photograph quality printer printhead.

In the fuse configuration, the memory is an array of fuse memory elements. Each fuse memory element has a unique power transistor to enable writing or reading. This type of fuse memory has a constant memory density, for example, 140 bits per square millimeter. For example, a set of 13 fuses and programming transistors in an area 280 $\mu$m×340 $\mu$m (95200 $\mu m^2$) yields 7323 $\mu m^2$ per fuse, which is 137 fuses per 1,000,000 $\mu m^2$ (or 1 $mm^2$). Typical read currents are less than 5 mA; typical write or programming current is greater than 50 mA. Power transistors capable of generating the required programming current typically occupy a very large area per fuse. As a result, the number of memory elements is limited depending upon printhead size.

SUMMARY OF THE INVENTION

Accordingly, there is a need for an improved memory for a printhead. In one form, the present invention provides a programmable memory on an inkjet printhead chip. The memory comprises a memory array that has a plurality of memory elements. The memory also comprises a bipolar device that isolates a /memory element from another memory element in the memory array.

In another form, the present invention provides a programmable memory on an inkjet printhead chip. The memory comprises a memory array that has a plurality of circuit elements arranged in rows and a plurality of circuit elements arranged in columns. The columns intersect the rows to thereby form a plurality of memory elements. The memory also includes a bipolar element that is coupled to the memory element and that is configured to isolate the memory element from another memory element.

In yet another form, the present invention provides a method of providing high fuse density in a printhead heater chip. The method comprises the acts of arranging a plurality of memory elements in a memory array, and isolating a memory element from another memory element in the memory array with a bipolar device.

Other features and advantages of the invention will become apparent to those skilled in the art upon review of the following detailed description, claims, and drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. In addition, the terms "connected" and "coupled" and variations thereof are not restricted to physical or mechanical connections or couplings.

DETAILED DESCRIPTION

Figure 1:
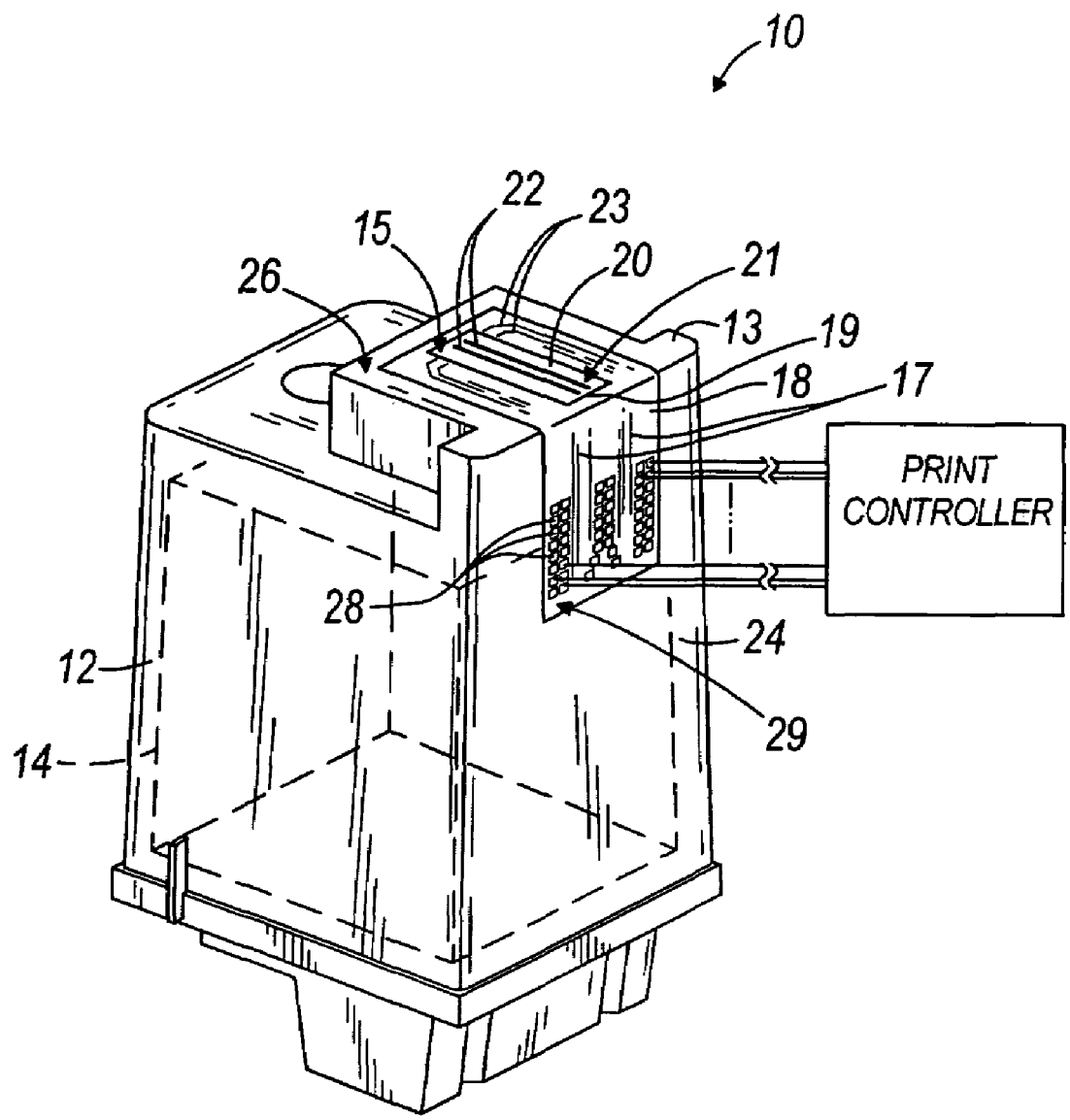
FIG. 1 illustrates an inkjet printhead according to one embodiment of the present invention.

FIG. 1 illustrates an inkjet printhead 10 according to one embodiment of the present invention. The printhead 10 includes a housing 12 that defines a nosepiece 13 and an ink reservoir 14 containing ink or a foam insert saturated with ink. The housing 12 can be constructed of a variety of materials including, without limitation, at least one of polymers, metals, ceramics, composites, and the like. The inkjet printhead 10 illustrated in FIG. 1 has been inverted to illustrate a nozzle portion 15 of the printhead 10. The nozzle portion 15 is located at least partially on a bottom surface 11 of the nosepiece 13 for transferring ink from the ink resevoir 14 onto a printing medium. The nozzle portion 15 can include a heater chip 16 (not visible in FIG. 1) and a nozzle plate 20 having a plurality of nozzles 22 that define a nozzle arrangement and from which ink drops are ejected onto printing medium that is advanced through a printer (not shown). The nozzles 22 can have any cross-sectional shape desired including, without limitation, circular, elliptical, square, rectangular, and any other polygonal shape that allows ink to be transferred from the printhead 10 to a printing medium. The heater chip 16 can be formed of a variety of materials including, without limitation, various forms of doped or non-doped silicon, dopes or non-doped germanium, or any other semiconducting material. The heater chip 16 is positioned to be in electrical communication with conductive traces 17 provided on an underside of a tape member 18. The tape member 18 is coupled to one side 24 of the housing 12 and most of an underside 26 of the nosepiece 13. Each conductive trace 17 connects at one end to a contact pad, bond or wire 23 adjacent the nozzle portion 15 and terminates at an opposite end at a contact pad 28.

The heater chip 16 is hidden from view in the assembled printhead 10 illustrated in FIG. 1 and is attached to the nozzle plate 20 in a removed area or cutout portion 19 of the tape member 18 such that an outwardly facing surface 21 of the nozzle plate 20 is generally flush with and parallel to an outer surface 29 of the tape member 18 for directing ink onto a printing medium via the plurality of nozzles 22 in fluid communication with the ink reservoir 14.

Figure 2:
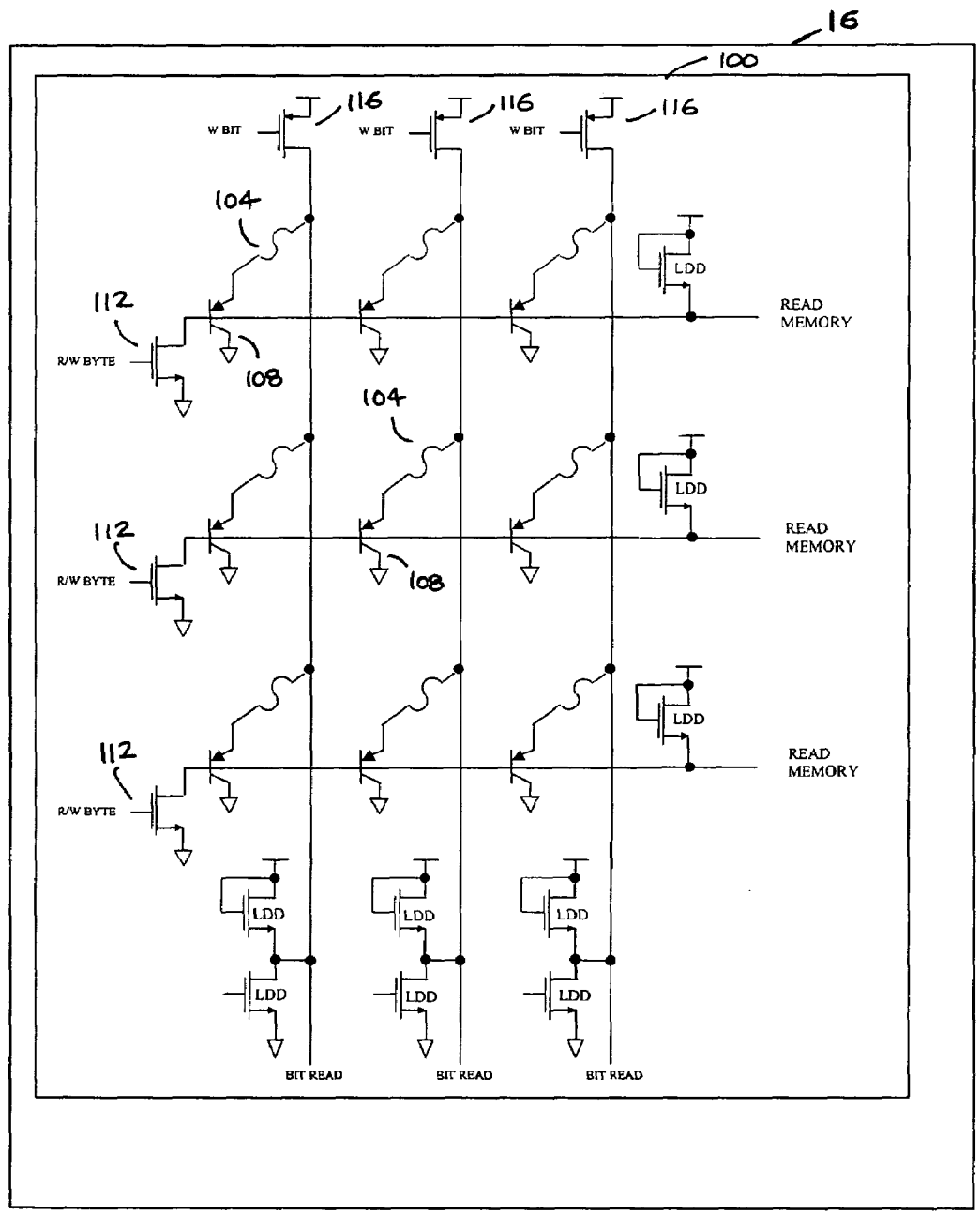
FIG. 2 shows a fuse-diode matrix arrangement of one embodiment of the present invention

FIG. 2 shows a portion of a fuse-bipolar matrix memory arrangement or a programmable memory array 100 positioned in the heater chip 16 arranged according to the present invention. Specifically, the portion shown in FIG. 2 is from a 128 bytes by 8 bits array, that is, the array has a total of 1024 fuses. Although only a portion of the array of fuses is shown (as a 3×3 array), other fuse numbers can be achieved by the present invention. Furthermore, a floating gate can also be used in place of the fuse 104 in other embodiments. The fuse element 104 can be a tantalum aluminum (TaAl) filament, a tantalum aluminum nitride (TaAlN) filament, and the like. The heater chip 16 can also have a plurality of heater layers depending on the application.

The memory array 100 has a plurality of bipolar devices 108 such as diodes, pnp transistors, or npn transistors. The bipolar devices 108 are used to isolate each fuse 104 so that a transistor can be used to program or read many different fuses based on the address sent from a printer. Specifically, a plurality of row programming transistors 112, and a plurality of column programming transistors 116 form the array of memory elements. The memory 100 can be programmed by selecting the row power transistor 112 and a corresponding column 116. Having the row transistors and the column transistors thus reduces areas covering the fuse 104 and the bipolar device 108. As a result, overall area of the array 100 can be greatly reduced or the number of memory elements can be increased in a same amount of chip area.

Figure 3:
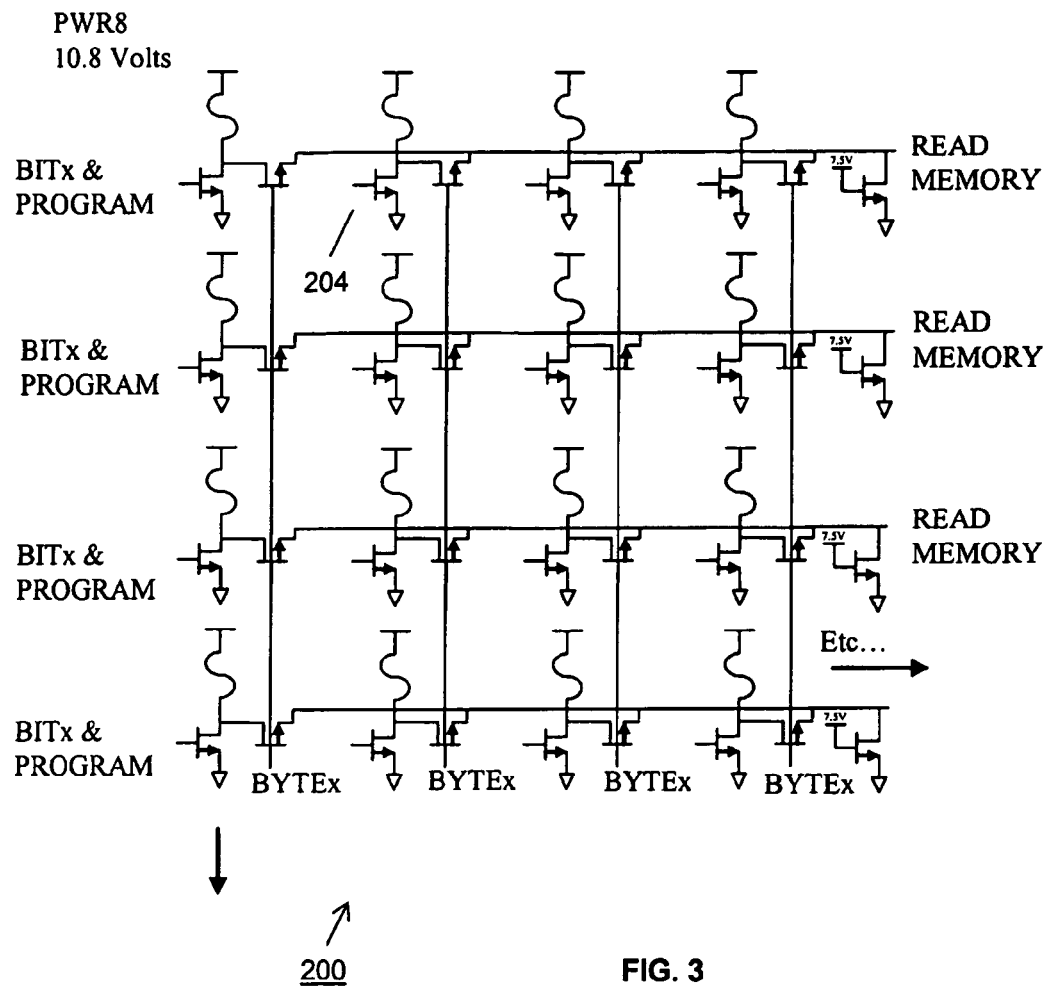
FIG. 3 shows a basic fuse configuration.

When compared to a basic fuse configuration 200 as shown in FIG. 3, the basic fuse configuration 200 requires a programming transistor 204 for each memory element. For example, printhead model HP57 of Hewlett Packard uses 13 fuses and 13 programming transistors in an area 280 $\mu m \times 340$ $\mu m$, or 95200 $\mu m^2$. In other words, the HP57 printhead has a fuse density of 95200 $\mu m^2/13$ fuses, or 7323 $\mu m^2$ per fuse, which is approximately 1,000,000 $\mu m^2/7323$ $\mu m^2$ or 137 fuses per 1,000,000 $\mu m^2$ (or 1 $mm^2$). Furthermore, there are two groups of these fuses on the HP57 for a total of 26 fuses on the chip. The memory arrangement 100 in FIG. 2, on the other hand, only requires a programming transistor 116 for each bit and byte rows.

Figure 4:
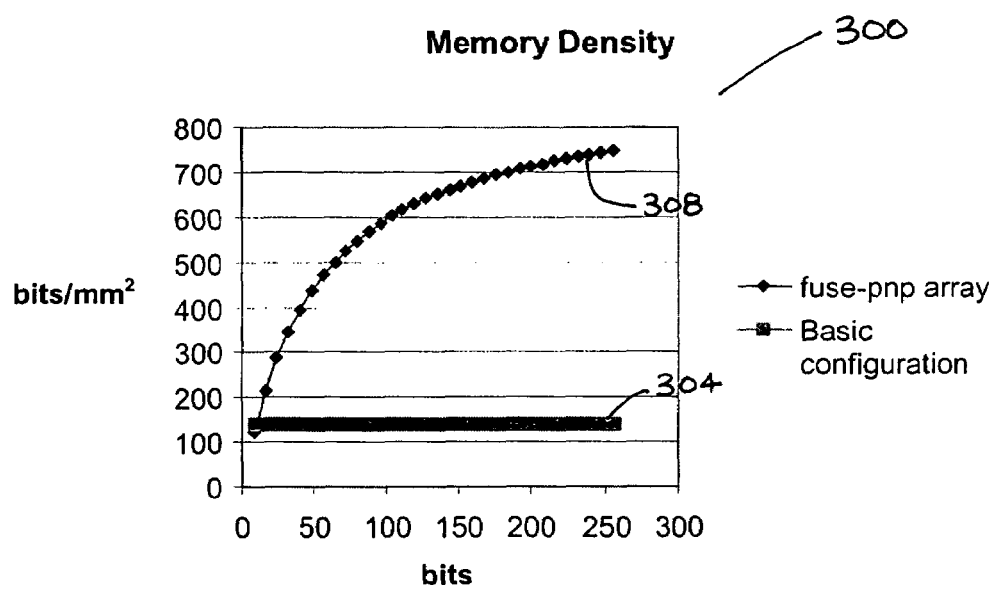
FIG. 4 shows a graph comparing fuse densities obtained from the arrangements in FIGS. 2 and 3.

In other words, due to the fact that a power transistor occupies relatively larger area, the relatively smaller area occupied by a bipolar device allows the memory array 100 to be relatively smaller in size. As shown in FIG. 4, the memory density obtained with the basic fuse configuration 200 is a generally constant curve 304. On the other hand, as the array 100 or number of bits increases, the corresponding memory density or bits per square millimeter increases (curve 308) as shown in FIG. 4. For example, a 2×8 array of 16 bits has a memory density of at least 200 bits per square millimeter. In another example, an array of 200 bits has a memory density of at least 700 bits per square millimeter using the array configuration in FIG. 2. In contrast, 140 bits per square millimeter is obtained regardless of the number of bits used with the array configuration in FIG. 3.

Figure 5:
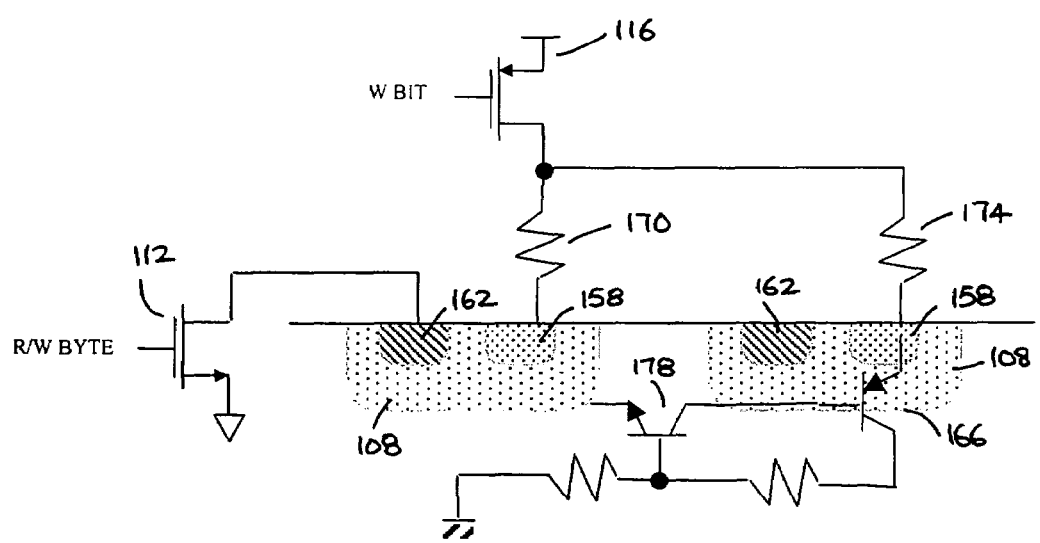
FIG. 5 shows a sectional view of a portion of the arrangement in FIG. 2 according to one embodiment of the invention.
Figure 6:
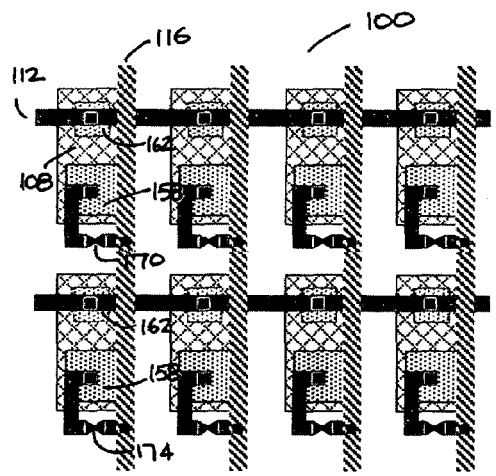
FIG. 6 shows a top view of the portion of the arrangement in FIG. 5 according to one embodiment of the invention.

FIGS. 5 and 6 show a sectional view and a top view, respectively, of a portion of the memory arrangement 100. As shown in FIG. 5, a bit column programming transistor 116 is coupled to a p-type emitter 158, and a byte row programming transistor 112 is coupled to an n-type base 162. When both the bit programming transistor 116 and the byte programming transistor 112 are activated to write to fuse 170, a parasitic effect or latch up condition may occur. For example, a parasitic vertical pnp device 166 will be formed by a second fuse 174 and a parasitic lateral NPN device 178. The parasitic vertical pnp device 166 may be turned on when the transistors 112, 116 are activated. The latch up condition will cause fuse 174 to be programmed unintentionally. As a result, in order to achieve high density memory using the memory array arrangement 100, the bipolar devices 108 such as pnp devices are also isolated to prevent the latch up condition.

Figure 7:
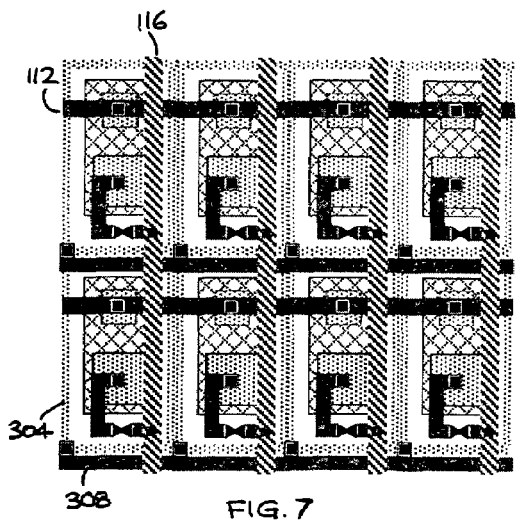
FIG. 7 shows a top view of a portion of the arrangement in FIG. 5 with a p-type surrounding guard ring according to the present invention.
Figure 8:
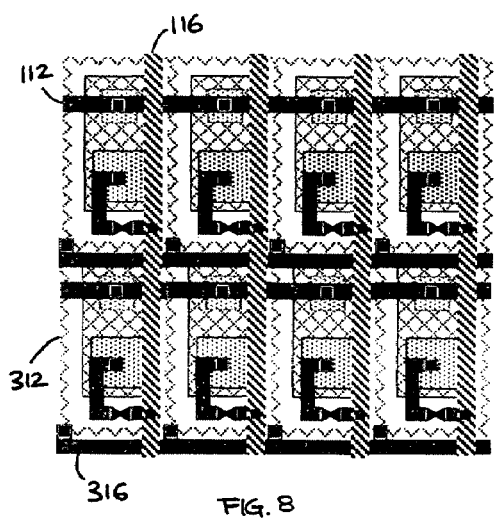
FIG. 8 shows a top view of a portion of the arrangement in FIG. 5 with a n-type surrounding guard ring according to the present invention.

To prevent the latch up condition described above, the bipolar devices 108 are generally isolated with a surrounding guard ring as shown in FIGS. 7, and 8. Specifically, a p-type surrounding guard ring 304 is connected to a ground rail 308. The p-type surrounding guard ring 304 is also positioned around each of the bipolar devices 108 in FIG. 7. In this way, the ground connected p-type surrounding guard ring 304 will provide a current drainage through the ground rail 308 for the parasitic currents. Similarly, an n-type surrounding guard ring 312 is connected to a voltage rail 316 that provides high potentials, as shown in FIG. 8. The n-type surrounding guard ring 312 is also positioned around each of the bipolar devices 108. Thus, the voltage rail connected n-type guard ring 312 will also provide a current drainage through an n-type base of the surrounding guard ring 312.

Figure 9:
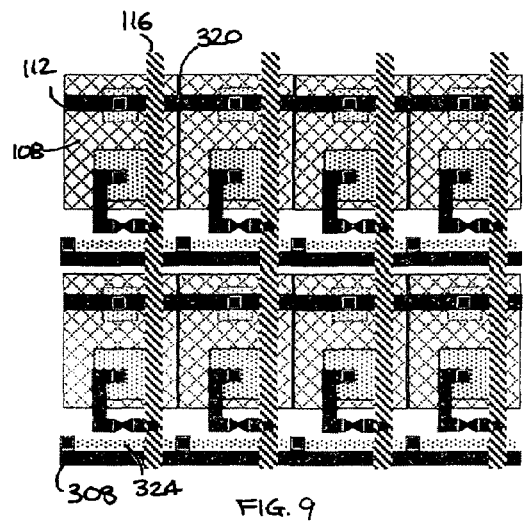
FIG. 9 shows a top view of a portion of the arrangement in FIG. 5 with a common surrounding guard ring according to the present invention.

In another embodiment, the latch up condition can also be prevented by having a common device type between the bipolar devices 108. As shown in FIG. 9, each bipolar device 108 has an n-well 320 encompassing both the p-type emitter 158 and the n-type base 162. The n-well 320 of the bipolar device 108 is joined with the n-well 320 of an adjacent bipolar device 108 that is connected to the same row programming transistor 112. FIG. 9 also shows that the latch up condition can also be prevented by a p-type isolation 324 connected to the ground rail 308. In yet another embodiment, an n-type isolation can be connected to the voltage rail 316 that provides high potentials.

Various features and advantages of the invention are set forth in the following claims.

What is claimed is:

1. A programmable memory on an inkjet printhead chip, the memory comprising:
   a memory array having a plurality of memory elements;
   a plurality of field-effect programming transistors configured to program the memory elements with a programming current; and
   a plurality of bipolar devices, each of the bipolar devices associated with each of the memory elements and isolating the programming current in each of the memory elements from another memory element in the memory array.

2. The programmable memory of claim 1, wherein at least one of the memory elements comprises a fuse element.

3. The programmable memory of claim 2, wherein the fuse element comprises at least one of tantalum aluminum, and tantalum aluminum nitride.

4. The programmable memory of claim 1, further comprising a plurality of layered heaters.

5. The programmable memory of claim 1, wherein at least one of the memory elements comprises a floating gate element.

6. The programmable memory of claim 1, wherein each of the bipolar devices comprises a pnp device.

7. The programmable memory of claim 6, further comprising a surrounding guard ring configured to isolate one pnp device from another pnp device.

8. The programmable memory of claim 7, wherein the surrounding guard ring comprises a p-type guard ring positioned around each pnp device.

9. The programmable memory of claim 7, wherein the surrounding guard ring comprises an n-type guard ring coupled to a high potential.

10. The programmable memory of claim 7, wherein each of the memory elements is positioned within the surrounding guard ring.

11. The programmable memory of claim 7, wherein each of the memory elements is positioned outside the surrounding guard ring.

12. The programmable memory of claim 6, wherein the memory array comprises rows and columns, wherein each of the pnp devices has an n-type base, and wherein the pnp devices on each row are joined at the n-type base.

13. The programmable memory of claim 6, wherein the pnp devices are arranged in a plurality of rows and columns intersecting each other, and wherein the pnp devices on a row are isolated from the pnp devices of another row by a grounded p-type region.

14. The programmable memory of claim 6, wherein the pnp devices are arranged in a plurality of rows and columns intersecting each other, and wherein the pnp devices on a row are isolated from the pnp devices of another row by a high potential n-type region.

15. The programmable memory of claim 1, wherein each of the bipolar devices comprises an npn device.

16. The programmable memory of claim 1, wherein each of the bipolar devices comprises a diode.

17. The programmable memory of claim 1, further comprising a memory density based on a sum of areas occupied by the memory elements and the plurality of programming transistors associated with the memory elements, wherein the memory density is at least 200 bits per square millimeter.

18. The programmable memory of claim 1, wherein the memory array has at least 128 memory elements, and each of the memory elements has a resistance of at least 5 ohms on the inkjet printhead chip.

19. A programmable memory on an inkjet printhead chip, the memory comprising:
a memory array having a plurality of fuse elements arranged in rows and a plurality of fuse elements arranged in columns intersecting the rows to thereby form a plurality of memory elements;
a plurality of field-effect programming transistors configured to program the memory elements with a programming current; and
a plurality of bipolar elements, each of the bipolar elements coupled to each of the memory elements and configured to isolate the programming current in each of the memory elements from another memory element.

20. The programmable memory of claim 19, wherein each of the fuse elements comprises at least one of tantalum aluminum, and tantalum aluminum nitride.

21. The programmable memory of claim 19, further comprising a plurality of layered heaters.

22. The programmable memory of claim 19, wherein each of the bipolar elements comprises a pnp device.

23. The programmable memory of claim 22, further comprising a surrounding guard ring configured to isolate the pnp device from another pnp device.

24. The programmable memory of claim 23, wherein the surrounding guard ring comprises a p-type guard ring positioned around each pnp device.

25. The programmable memory of claim 23, wherein the surrounding guard ring comprises an n-type guard ring coupled to a high potential.

26. The programmable memory of claim 23, wherein each of the memory elements is positioned within the surrounding guard ring.

27. The programmable memory of claim 23, wherein each of the memory elements is positioned outside the surrounding guard ring.

28. The programmable memory of claim 22, wherein each pnp device has an n-type base, and wherein the pnp devices on each row are joined at an n-type base.

29. The programmable memory of claim 22, wherein the pnp devices on a row are isolated from the pnp devices of another row by a grounded p-type region.

30. The programmable memory of claim 22, and wherein the pnp devices on a row are isolated from the pnp devices of another row by a high potential n-type region.

31. The programmable memory of claim 19, wherein each of the bipolar elements comprises an npn device.

32. The programmable memory of claim 19, wherein each of the bipolar elements further comprises a plurality of layered heaters.

33. The programmable memory of claim 19, further comprising a memory density based on a sum of areas occupied by the memory elements and the plurality of programming transistors, wherein the fuse memory density is at least 200 bits per square millimeter.

34. The programmable memory of claim 19, wherein the memory has at least 128 memory elements, and each memory element has a resistance of at least 5 ohms on the inkjet printhead chip.

35. A method of providing high fuse density in a printhead heater chip, the method comprising:
arranging a plurality of memory elements in a memory array;
programming the memory elements with a programming current with a plurality of field-effect programming transistors; and
isolating the programming current in each of the memory elements from another memory element in the memory array with a bipolar device.

36. The method of claim 35, wherein each of the memory elements comprises a fuse element.

37. The method of claim 36, wherein the fuse element comprises at least one of tantalum aluminum, and tantalum aluminum nitride.

38. The method of claim 35, further comprising providing a plurality of layered heaters on the heater chip.

39. The method of claim 35, wherein at least one of the memory elements comprises a floating gate element.

40. The method of claim 35, wherein each of the bipolar devices comprises a pnp device.

41. The method of claim 40, further comprising isolating the pnp device with a surrounding guard ring.

42. The method of claim 41, wherein the surrounding guard ring comprises a p-type guard ring, further comprising positioning the p-type guard ring around each pnp device.

43. The method of claim 41, wherein the surrounding guard ring comprises an n-type guard ring, further comprising coupling the n-type guard ring to a high potential.

44. The method of claim 41, further comprising positioning each of the memory elements within the surrounding guard ring.

45. The method of claim 41, further comprising positioning each of the memory elements outside the surrounding guard ring.

46. The method of claim 40, wherein the memory array comprises rows and columns, and each pnp device has an n-type base, further comprising joining the pnp devices on each row at the n-type base.

47. The method of claim 40, further comprising:
arranging the pnp devices in a plurality of rows and columns intersecting each other; and
isolating the pnp devices on a row from the pnp devices of another row by a grounded p-type region.

48. The method of claim 40, further comprising:
arranging the pnp devices in a plurality of rows and columns intersecting each other; and
isolating the pnp devices on a row from the pnp devices of another row by a high potential n-type region.

49. The method of claim 35, wherein each of the bipolar devices comprises an npn device.

50. The method of claim 35, wherein each of the bipolar devices comprises a diode.

51. The method of claim 35, further comprising providing a memory density of at least 200 bits per square millimeter including a sum of areas occupied by the memory elements and the plurality of programming transistors.

52. The method of claim 35, further comprising providing at least 128 memory elements, each of the memory elements having a resistance of at least 5 ohms on the inkjet printhead chip.

53. A programmable memory on an inkjet printhead chip, the memory comprising:
a memory array having a plurality of memory elements, programming transistors configured to program the memory elements with a programming current, and bipolar transistors, each of the bipolar transistors being associated with each of the memory elements, and configured to isolate the programming current in each of the memory elements from another memory element and having a memory density comprising a sum of areas occupied by the memory elements and the programming transistors, and wherein the memory density is at least 200 bits per square millimeter.

54. A programmable memory on an inkjet printhead chip, the memory comprising:
a memory array having at least 128 memory elements; and
a plurality of field-effect programming transistors configured to program the memory elements with a programming current; and
a plurality of at least 128 bipolar devices, each of the at least 128 bipolar devices associated with each of the at least 128 memory elements, and configured to isolate the current in one memory element from another memory element, and wherein each memory element has a resistance of at least 5 ohms on the inkjet printhead chip.

* * * * *